United States Patent
Larsson

[19]

[11] Patent Number: 6,087,902
[45] Date of Patent: Jul. 11, 2000

[54] PHASE-LOCKED LOOP (PLL) CIRCUIT CONTAINING A BIASED PHASE DETECTOR FOR IMPROVED FREQUENCY ACQUISITION

[75] Inventor: Patrik Larsson, Matawan, N.J.

[73] Assignee: Lucent Technologies Inc., Murray Hill, N.J.

[21] Appl. No.: 09/015,035

[22] Filed: Jan. 28, 1998

[51] Int. Cl.$^7$ ............................ H03L 7/085; G01R 25/00
[52] U.S. Cl. ............................ 331/25; 331/1 A; 331/17; 327/7; 327/156; 327/159
[58] Field of Search ................................. 331/1 A, 4, 8, 331/16, 17, 25, DIG. 2; 327/5, 7–11, 156–159

[56] References Cited

U.S. PATENT DOCUMENTS

| | | | |
|---|---|---|---|
| 4,636,748 | 1/1987 | Latham, II | 331/17 |
| 4,818,950 | 4/1989 | Ranger | 328/155 |
| 5,166,641 | 11/1992 | Davis et al. | 331/1 A |

OTHER PUBLICATIONS

T.H. Hu, P.R. Gray, "A Monolithic 480 Mb/s Parallel AGC/Decision/Clock–Recovery Circuit in 1.2–$\mu$m CMOS," I.E.E.E. J. of Solid–State Circuits, vol. 28, No. 12, 1314–20 (1993). Dec. 1993, pp. 1314–1320.

J.D.H. Alexander, "Clock Recovery From Random Binary Signals," Electr. Lett., vol. 11, No. 22, pp. 541–542 (Oct. 1975).

*Primary Examiner*—David Mis

[57] ABSTRACT

An extended frequency lock range is achieved in a PLL circuit based on sampled phase detectors by modifying a conventional PLL circuit to utilize a biased phase detector to achieve frequency acquisition of the oscillator output signal, without the need for a lock detector. A biased phase detector applies more phase error correction in one direction than in the other direction. For example, a positive biased phase detector applies more positive current, $I_{UP}$, over time than negative current, $I_{DOWN}$. For a positive biased phase detector, the VCO control voltage is initialized to a value below the lock-in voltage, and the positive biased phase detector will cause a steady increase in the VCO control voltage until the PLL locks, thereby causing the phase error to be approximately zero. Likewise, for a negative biased phase detector, the VCO control voltage is initialized to a value above the lock-in voltage, and the negative biased phase detector will cause a steady decrease in the VCO control voltage until the PLL locks, thereby causing the phase error to be approximately zero.

18 Claims, 4 Drawing Sheets

PHASE-LOCKED LOOP (PLL) CIRCUIT CONTAINING A BIASED PHASE DETECTOR FOR IMPROVED FREQUENCY ACQUISITION

CROSS-REFERENCE TO RELATED APPLICATIONS

The present invention is related to the following United States Patent Applications filed contemporaneously herewith: United States Patent Application entitled "A Phase-Locked Loop (PLL) Circuit Containing a Sampled Phase Detector With Reduced Jitter," (Attorney Docket Number Larsson 9); United States Patent Application entitled "A Phase-Locked Loop (PLL) Circuit Containing a Frequency Detector For Improved Frequency Acquisition," (Attorney Docket Number Larsson 10) and United States Patent Application entitled "A Phase-Locked Loop (PLL) Circuit Containing a Phase Detector For Achieving Byte Alignment," (Attorney Docket Number Larsson 11), each assigned to the assignee of the present invention and incorporated by reference herein.

FIELD OF THE INVENTION

The present invention relates to phase-locked loop (PLL) circuits, and more particularly, to frequency acquisition techniques for phase-locked loop (PLL) circuits containing sampled phase detectors.

BACKGROUND OF THE INVENTION

Phase-locked loop (PLL) circuits are frequently utilized to lock an oscillator in phase with a reference signal. PLL circuits are often utilized within receivers in digital communication systems to generate a local clock signal that is phase aligned with an incoming reference signal. The phase aligned local clock signal facilitates the receipt and processing of synchronous data sent by a transmitter in the communication system.

A conventional PLL circuit includes a phase detector, a filter and a voltage-controlled oscillator (VCO). In the conventional PLL circuit, the phase detector compares the incoming reference signal and the output of the VCO. The phase detector generates an error signal that is representative of the phase difference of the reference signal and the VCO output. The error signal is filtered and applied to the control input of the VCO to produce an output signal that tracks the phase of the reference signal.

A potential problem exists, however, for a PLL circuit based on sampled phase detectors. Specifically, for large frequency errors, conventional sampled phase detectors are equally likely to generate a positive or negative phase correction signal, regardless of the actual polarity of the frequency error, since the likelihood of sampling before and after a data edge (due to the frequency error) is fifty percent (50%) each. Thus, it is necessary to ensure that large frequency errors do not occur by extending the frequency lock range of the PLL circuit.

Conventional techniques for extending the frequency lock range of a PLL circuit based on sampled phase detectors utilize a square wave as an auxiliary input to initially tune the VCO, while using an additional phase and frequency detector (PFD) to compare the frequency of the auxiliary input to the VCO output. Once the VCO is tuned to the desired frequency in this manner, the additional phase and frequency detector (PFD) is switched out of the PLL feedback loop, and the sampled phase detector is utilized to phase lock onto the incoming data. Relying on the presence of an external reference signal, such as a square wave, to extend the frequency lock range, however, may not be practical in many receiver applications where the only received signal is the incoming random data.

Improved frequency acquisition has been achieved by sweeping the frequency of the VCO output, $V_O$, to search for the signal frequency. The PLL will lock when the frequency of the VCO output, $V_O$, is sufficiently close to the frequency of the reference signal. A lock detector determines when the VCO locked up, and then turns off the applied voltage ramp.

SUMMARY OF THE INVENTION

A PLL circuit is disclosed that achieves an extended frequency lock range by modifying a conventional PLL circuit to utilize a biased phase detector to achieve frequency acquisition of the oscillator output signal. Thus, the PLL will lock without the need for an applied voltage ramp or lock detector. As used herein, a biased phase detector applies more phase error correction in one direction than in the other direction. For example, a positive biased phase detector applies more positive current, $I_{UP}$, over time than negative current, $I_{DOWN}$.

For a positive biased phase detector, the VCO control voltage is initialized to a value below the lock-in voltage, and the positive biased phase detector will cause a steady increase in the VCO control voltage until the PLL locks, thereby causing the phase error to be approximately zero. In one implementation, a positive biased phase detector is achieved by suppressing the response for a predefined percentage of detected negative phase errors, while applying the same magnitude positive current, $I_{UP}$, and negative current, $I_{DOWN}$. For example, every second detected negative phase error can be ignored. Alternatively, a positive biased phase detector can be achieved by providing a larger magnitude positive current, $I_{UP}$, than negative current, $I_{DOWN}$.

Likewise, for a negative biased phase detector, the VCO control voltage is initialized to a value above the lock-in voltage, and the negative biased phase detector will cause a steady decrease in the VCO control voltage until the PLL locks, thereby causing the phase error to be approximately zero. In one implementation, a negative biased phase detector is achieved by suppressing the response for a predefined percentage of detected positive phase errors, while applying the same magnitude positive current, $I_{UP}$, and negative current, $I_{DOWN}$. For example, every second detected positive phase error can be ignored. Alternatively, a negative biased phase detector can be achieved by providing a larger magnitude negative current, $I_{DOWN}$, than positive current, $I_{up}$.

DETAILED DESCRIPTION

Figure 1:
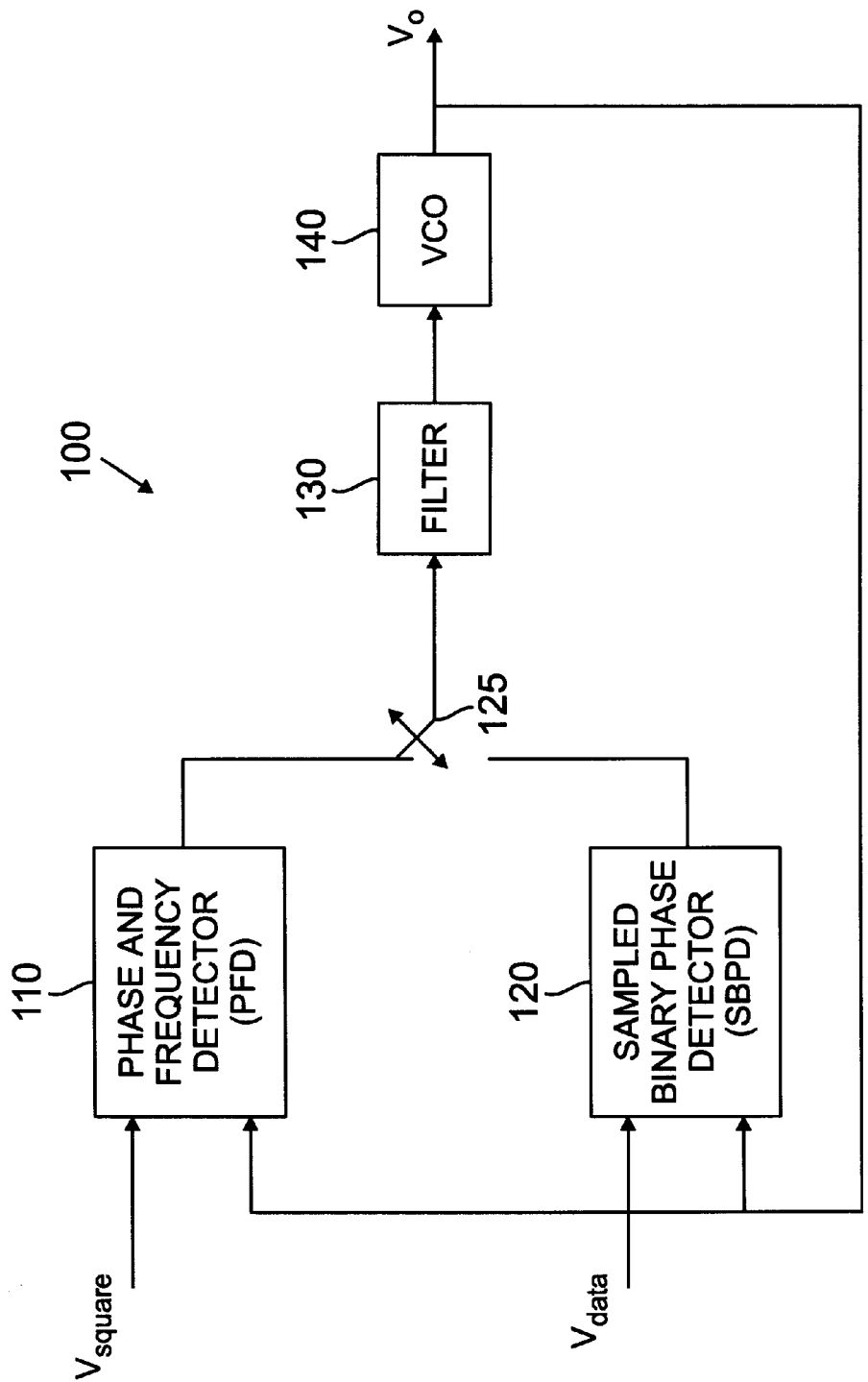
FIG. 1 is a schematic block diagram illustrating a PLL circuit providing an extended frequency lock range.

FIG. 1 illustrates a conventional PLL circuit 100 providing an extended frequency lock range by utilizing a square wave as an auxiliary input to initially tune the voltage-controlled oscillator (VCO) 140, while using a phase and frequency detector (PFD) 110 to compare the frequency of the auxiliary input square wave to the VCO output, $V_O$. Once the VCO 140 is tuned to the frequency of the auxiliary input square wave, $V_{square}$, a switch 125 is activated to utilize a phase detector 120 to phase lock the VCO output, $V_O$, onto the incoming data.

Thus, the PLL circuit 100, shown in FIG. 1, includes a phase and frequency detector 110, a phase detector 120, a switch 125, a low pass filter 130 and a voltage-controlled oscillator (VCO) 140. Initially, the phase and frequency detector 110 compares the incoming auxiliary reference signal, $V_{square}$, and the output of the VCO, $V_O$. The phase and frequency detector 110 generates an error signal, $I_{err}$, representing the phase and frequency differences between the auxiliary reference signal, $V_{square}$, and the VCO output, $V_O$, until the VCO 140 is tuned to the frequency of the auxiliary input square wave, $V_{square}$. The error signal, $I_{err}$, produced by the phase and frequency detector 110 is filtered by the filter 130 and applied to the VCO 140 to produce an output signal, $V_O$, that tracks the phase and frequency of the signal, $V_{square}$. The VCO has a lock-in voltage defined to be the ideal voltage for which the PLL can lock without a cycle slip.

Thereafter, the phase detector 120 compares the incoming reference signal, $V_{data}$, and the output of the VCO, $V_O$. The phase detector 120 generates an error signal, $I_{err}$, representing the phase difference between the incoming data signal, $V_{data}$, and the VCO output, $V_O$. The error signal, $I_{err}$, produced by the phase detector 120 is filtered by the filter 130 and applied to the VCO 140 to produce an output signal, $V_O$, that tracks the phase of the signal, $V_{data}$.

Figure 2:
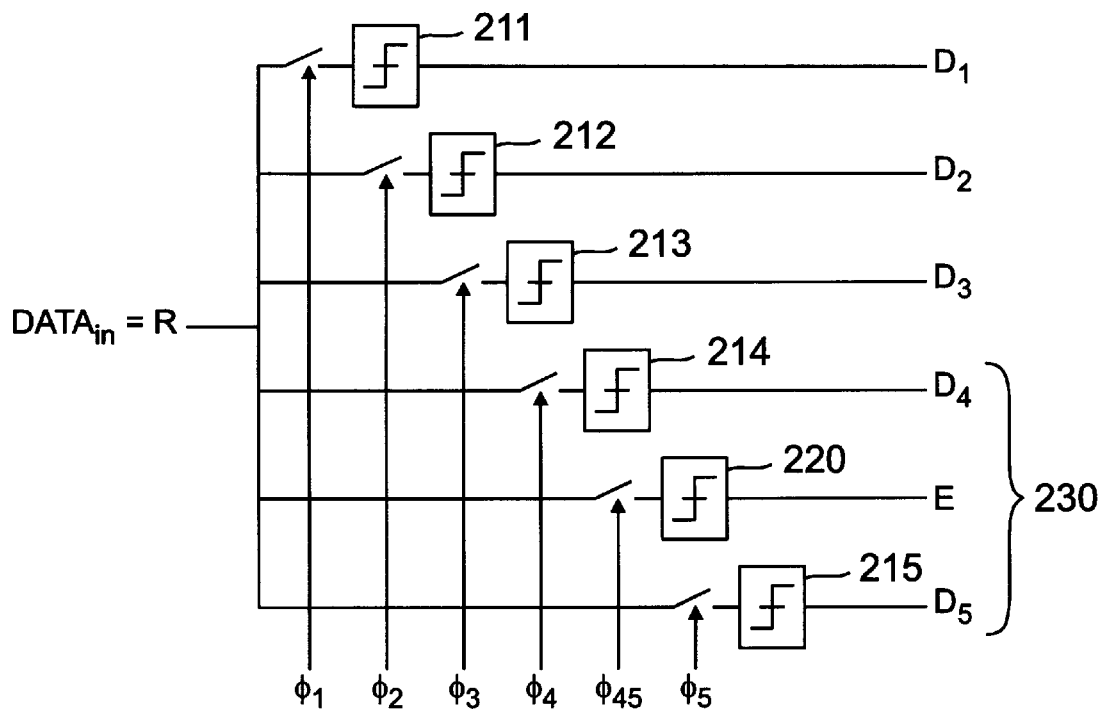
FIG. 2 is a schematic block diagram illustrating a parallel data receiver circuit.
Figure 3:
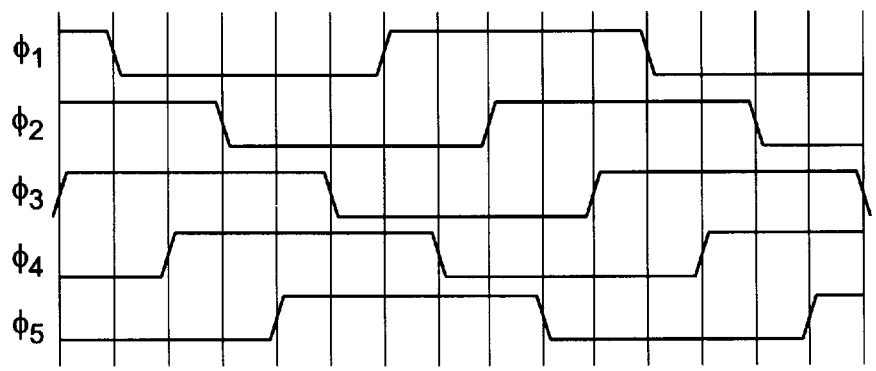
FIG. 3 the various clock cycles utilized to trigger each of the data samplers of FIG. 2.

FIG. 2 illustrates an illustrative conventional parallel data receiver circuit having five parallel data samplers 211–215 for sampling incoming data. As shown in FIG. 3, the clock phases, $\phi_1$–$\phi_5$, from the VCO output, $V_O$, are skewed by an amount equal to one-fifth of a clock cycle or period, and their rate is one-fifth of the rate of the incoming data. An edge detector 220, in cooperation with the two adjacent data samplers 214–215, operates as a phase detector 230, clocked by a clock phase, $\phi_{45}$, which is between $\phi_4$ and $\phi_5$. The edge detector 220 only observes every fifth data edge. The edge detector 220 can be embodied, for example, as a D-type flip flop or can be made decision directed so that it also works for the reference signal being a data signal.

The edge detector 220 can be triggered by the inverse of $\phi_2$, as shown in FIGS. 2 and 3. In this manner, the sampled phase detector 230 serves to align the VCO output, $V_O$, with the edge in between data bits $D_4$ and $D_5$. Thus, if there is a binary transition from high to low, for example, between data bits $D_4$ and $D_5$, the measurement of the edge detector 220 will be either high or low, indicating whether the sampling is being done just before or just after the falling edge, respectively. Likewise, if there is a binary transition from low to high between data bits $D_4$ and $D_5$, the measurement of the edge detector 220 will be either low or high, indicating whether the sampling is being done just before or just after the rising edge, respectively.

Figure 4:
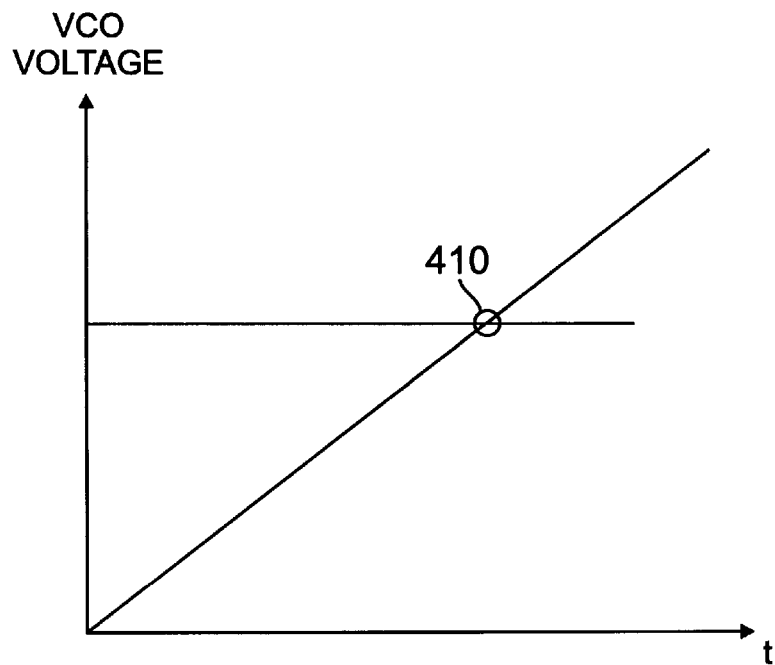
FIG. 4 illustrates a voltage ramp applied to a VCO control input during a conventional frequency sweeping process.

According to a feature of the present invention, an extended frequency lock range is achieved by modifying a conventional PLL circuit to utilize a biased phase detector to achieve frequency acquisition of the oscillator output signal without the need for an applied voltage ramp or lock detector. Conventional techniques achieve frequency acquisition by sweeping the frequency of the VCO output, $V_O$, to search for the signal frequency. The PLL will lock when the frequency of the VCO output, $V_O$, is sufficiently close to the frequency of the reference signal. FIG. 4 illustrates the voltage ramp that is utilized as the input to the VCO for the conventional frequency sweeping process. A lock detector (not shown) determines that the VCO is locked at a point 410 on the voltage ramp, and thereafter turns off the applied voltage ramp. If the sweeping is performed at too high a rate, the loop will not lock.

Thus, in accordance with the present invention, frequency acquisition is achieved without the need for a lock detector or a ramp voltage by utilizing a biased phase detector. As used herein, a biased phase detector applies more phase error correction in one direction than in the other direction. For example, a positive biased phase detector applies more positive current, $I_{UP}$, over time than negative current, $I_{DOWN}$.

Figure 5:
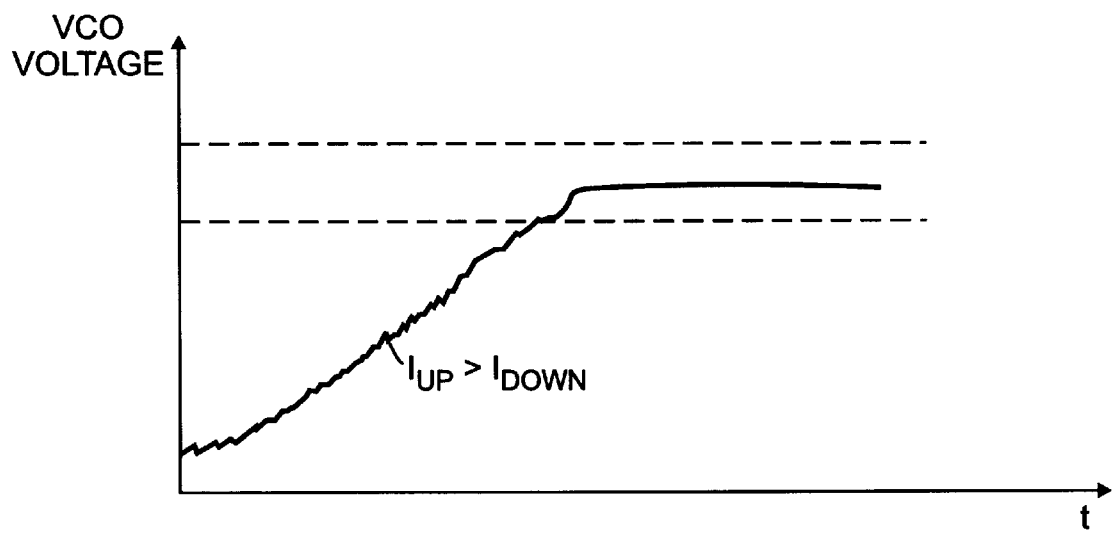
FIG. 5 illustrates the VCO control voltage produced by a biased phase detector in accordance with one embodiment of the present invention until the PLL enters the pull-in range and locks.

For a positive biased phase detector implementation, the VCO control voltage is initialized to a value below the lock-in voltage, and the positive biased phase detector will cause a steady increase in the VCO control voltage until the PLL locks, as shown in FIG. 5. In one implementation, a positive biased phase detector is achieved by suppressing the response for a predefined percentage of detected negative phase errors, while applying the same magnitude positive current, $I_{UP}$, and negative current, $I_{DOWN}$. For example, every second detected negative phase error can be ignored. Unlike conventional frequency sweeping techniques, the biased phase detector does not need to be switched off when the PLL locks.

Likewise, for a negative biased phase detector, the VCO control voltage is initialized to a value above the lock-in voltage of the VCO, and the negative biased phase detector will cause a steady decrease in the VCO control voltage until the PLL locks, thereby causing the phase error to be approximately zero. In one implementation, a negative biased phase detector is achieved by suppressing the response for a predefined percentage of detected positive phase errors, while applying the same magnitude positive current, $I_{UP}$, and negative current, $I_{DOWN}$. For example, every second detected positive phase error can be ignored.

Figure 6:
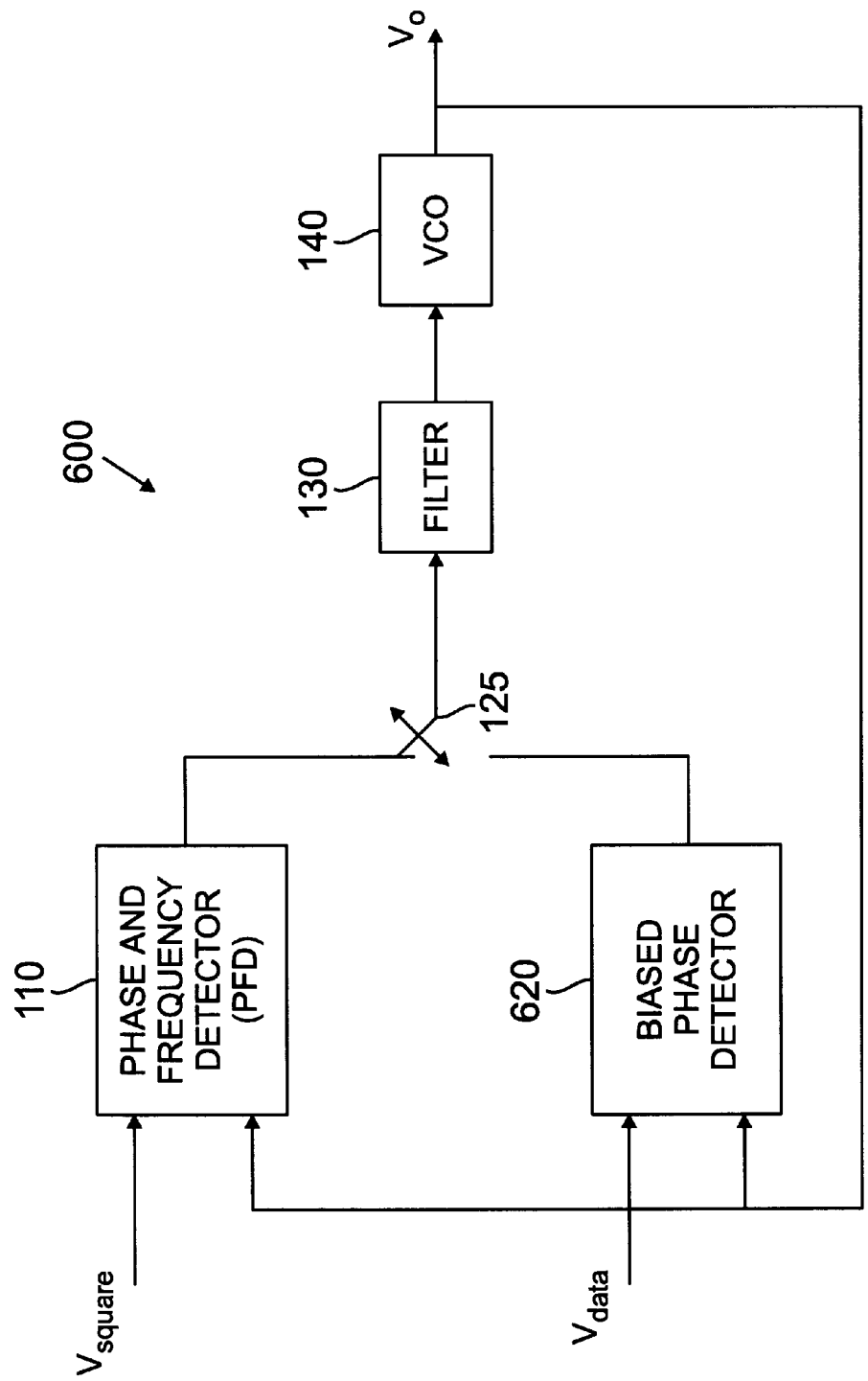
FIG. 6 illustrates a PLL circuit having a biased phase detector in accordance with the present invention.

FIG. 6 illustrates a PLL circuit 600 having a biased phase detector 620 in accordance with the present invention. The elements 110, 125, 130, 140 in the PLL circuit 600 of FIG. 6, may operate in the same manner as the like-numbered elements of FIG. 1.

It is to be understood that the embodiments and variations shown and described herein are merely illustrative of the principles of this invention and that various modifications may be implemented by those skilled in the art without departing from the scope and spirit of the invention.

I claim:

1. A method for locking the frequency of an oscillator output signal produced by a phase-locked loop (PLL) circuit including a voltage-controlled oscillator (VCO), said method comprising the steps of:

initializing a control voltage of said VCO to less than a locking voltage;

comparing an input signal to said oscillator output signal;

generating an error signal corresponding to the difference in phase of said input signal and said oscillator output signal only when there is a difference in said phases, wherein said error signal consists of positive current for positive phase differences and negative current for negative phase differences, wherein an amplitude of said positive current has a larger magnitude than an amplitude of said negative current for substantially all operating conditions; and applying said error signal to a governable oscillator to generate said oscillator output signal, said error signal causing said oscillator output signal to be substantially phase aligned with the input signal.

2. A method for locking the frequency of an oscillator output signal produced by a phase-locked loop (PLL) circuit including a voltage-controlled oscillator (VCO), said method comprising the steps of:

initializing a control voltage of said VCO to less than a locking voltage;

comparing an input signal to said oscillator output signal;

generating an error signal corresponding to the difference in phase of said input signal and said oscillator output signal only when there is a difference in said phases, wherein said error signal consists of positive current for positive phase differences and negative current for negative phase differences, and wherein said error signal is suppressed for one or more of said negative phase differences; and applying said error signal to a governable oscillator to generate said oscillator output signal, said oscillator output signal tracking the phase of the input signal.

3. The method according to claim 2, wherein said error signal corresponding to every predefined nth negative phase difference is suppressed.

4. A phase-locked loop (PLL) circuit for generating an oscillator output signal, comprising:

a biased phase detector for comparing an input signal to said oscillator output signal and for generating an error signal corresponding to the difference in phase of said input signal and said oscillator output signal only when there is a difference in said phases, said biased phase detector producing positive current, said biased phase detector producing negative current, wherein said biased phase detector produces more effective positive current than negative current for substantially all operating conditions; and a governable oscillator having a control terminal and an output, the control terminal receiving the current signal and the oscillator output being the output of the loop, said error signal causing said oscillator output to be substantially phase aligned with the incoming data signal, said governable oscillator being initialized to a voltage less than a locking voltage.

5. The phase-locked loop (PLL) circuit according to claim 4, wherein said governable oscillator is a voltage-controlled oscillator (VCO).

6. The phase-locked loop (PLL) circuit according to claim 4, wherein said loop filter is a low pass filter.

7. The phase-locked loop (PLL) circuit according to claim 4, wherein said biased phase detector is a sampled phase detector.

8. The phase-locked loop (PLL) circuit according to claim 4, wherein said biased phase detector generates larger positive current than negative current.

9. A phase-locked loop (PLL) circuit for generating an oscillator output signal, comprising:

a biased phase detector for comparing an input signal to said oscillator output signal and for generating an error signal corresponding to the difference in phase of said input signal and said oscillator output signal, wherein said biased phase detector suppresses said error signal for one or more of said negative phase differences to produce more positive current over time than negative current; and a governable oscillator having a control terminal and an output, the control terminal receiving the current signal and the oscillator output being the output of the loop, said oscillator output tracking the phase of the incoming data signal.

10. A method for locking the frequency of an oscillator output signal produced by a phase-locked loop (PLL) circuit including a voltage-controlled oscillator (VCO), said method comprising the steps of:

initializing a control voltage of said VCO to greater than a locking voltage;

comparing an input signal to said oscillator output signal;

generating an error signal corresponding to the difference in phase of said input signal and said oscillator output signal only when there is a difference in said phases, wherein said error signal consists of positive current for positive phase differences and negative current for negative phase differences, wherein an amplitude of said negative current has a larger magnitude than an amplitude of said positive current for substantially all operating conditions; and applying said error signal to a governable oscillator to generate said oscillator output signal, said error signal causing said oscillator output signal to be substantially phase aligned with the input signal.

11. A method for locking the frequency of an oscillator output signal produced by a phase-locked loop (PLL) circuit including a voltage-controlled oscillator (VCO), said method comprising the steps of:

initializing a control voltage of said VCO to greater than a locking voltage;

comparing an input signal to said oscillator output signal;

generating an error signal corresponding to the difference in phase of said input signal and said oscillator output signal only when there is a difference in said phases, wherein said error signal consists of positive current for positive phase differences and negative current for negative phase differences, and wherein said error signal is suppressed for one or more of said positive phase differences; and applying said error signal to a governable oscillator to generate said oscillator output signal, said oscillator output signal tracking the phase of the input signal.

12. The method according to claim 11, wherein said error signal corresponding to every predefined nth positive phase difference is suppressed.

13. A phase-locked loop (PLL) circuit for generating an oscillator output signal, comprising:

a biased phase detector for comparing an input signal to said oscillator output signal and for generating an error signal corresponding to the difference in phase of said input signal and said oscillator output signal only when there is a difference in said phases, wherein said error signal produces more effective negative phase correction than positive phase correction for substantially all operating conditions; and a governable oscillator having a control terminal and an output, the control terminal receiving the error signal and the oscillator output being the output of the loop, said error signal causing said oscillator output to be substantially phase aligned with the incoming data signal, said governable oscillator being initialized to a voltage greater than a locking voltage.

14. The phase-locked loop (PLL) circuit according to claim 13, wherein said error consists of larger negative current than positive current.

15. Aphase-locked loop (PLL) circuit for generating an oscillator output signal, comprising:

a biased phase detector for comparing an input signal to said oscillator output signal and for generating an error signal corresponding to the difference in phase of said input signal and said oscillator output signal, wherein said biased phase detector suppresses said error signal for one or more of said positive phase differences to produce more negative phase correction over time than positive phase correction; and a governable oscillator having a control terminal and an output, the control terminal receiving the error signal and the oscillator output being the output of the loop, said oscillator output tracking the phase of the incoming data signal.

16. A phase-locked loop (PLL) circuit for generating an oscillator output signal, comprising:

a biased phase detector for comparing an input signal to said oscillator output signal and for generating an error signal corresponding to the difference in phase of said input signal and said oscillator output signal only when there is a difference in said phases, wherein said error signal produces more effective positive phase correction than negative phase correction for substantially all operating conditions; and a governable oscillator having a control terminal and an output, the control terminal receiving the error signal and the oscillator output being the output of the loop, said error signal causing said oscillator output to be substantially phase aligned with the incoming data signal, said governable oscillator being initialized to a voltage less than a locking voltage.

17. The phase-locked loop (PLL) circuit according to claim 16, wherein said errors signal consists of larger positive current than positive current.

18. A phase-locked loop (PLL) circuit for generating an oscillator output signal, comprising:

a biased phase detector for comparing an input signal to said oscillator output signal and for generating an error signal corresponding to the difference in phase of said input signal and said oscillator output signal, wherein said biased phase detector suppresses said error signal for one or more of said negative phase differences to produce more positive phase correction over time than negative phase correction; and a governable oscillator having a control terminal and an output, the control terminal receiving the error signal and the oscillator output being the output of the loop, said oscillator output tracking the phase of the incoming data signal.

* * * * *